(12) United States Patent
Ren et al.

(10) Patent No.: US 9,196,602 B2
(45) Date of Patent: Nov. 24, 2015

(54) HIGH POWER DIELECTRIC CARRIER WITH ACCURATE DIE ATTACH LAYER

(71) Applicant: Hong Kong Applied Science and Technology Research Institute Company Limited, Hong Kong (HK)

(72) Inventors: Yuxing Ren, Hong Kong (HK); Ziyang Gao, Shenzhen (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 112 days.

(21) Appl. No.: 13/896,356

(22) Filed: May 17, 2013

(65) Prior Publication Data

US 2014/0339709 A1    Nov. 20, 2014

(51) Int. Cl.
*H01L 23/00* (2006.01)
*H01L 21/56* (2006.01)
*H01L 23/13* (2006.01)

(52) U.S. Cl.
CPC .............. *H01L 24/83* (2013.01); *H01L 21/563* (2013.01); *H01L 23/13* (2013.01); *H01L 24/04* (2013.01); *H01L 24/07* (2013.01); *H01L 24/12* (2013.01); *H01L 24/32* (2013.01); *H01L 24/29* (2013.01); *H01L 2224/27013* (2013.01); *H01L 2224/29111* (2013.01); *H01L 2224/32225* (2013.01); *H01L 2224/8314* (2013.01); *H01L 2224/83192* (2013.01); *H01L 2224/83385* (2013.01); *H01L2924/1305* (2013.01); *H01L 2924/13055* (2013.01); *H01L 2924/15747* (2013.01)

(58) Field of Classification Search
CPC ......... H01L 24/04; H01L 24/07; H01L 24/12; H01L 21/563
USPC ................................................... 257/782, 783
See application file for complete search history.

(56) References Cited

U.S. PATENT DOCUMENTS

| 5,214,307 A | 5/1993 | Davis |
| 6,691,406 B2 | 2/2004 | Prindivill et al. |

(Continued)

FOREIGN PATENT DOCUMENTS

| JP | 2004277837 A | 7/2004 |
| JP | 2010245161 A | 10/2010 |

OTHER PUBLICATIONS

Office Action issued from the State Intellectual Property Office of the People's Republic of China on Mar. 27, 2015, including a search report.

*Primary Examiner* — Phat X Cao
(74) *Attorney, Agent, or Firm* — Ella Cheong Hong Kong; Sam T. Yip

(57) ABSTRACT

A system for bonding a die to a high power dielectric carrier such as a ceramic dielectric core with double-sided conductive layers is described. In the system, the upper conductive layer has a first area whose surface has a first wettability. A second area that at least partially surrounds the first area has a surface with a second wettability that is greater than the first wettability. During bonding, an adhesive material bonding a chip to the substrate spreads among the first area by a downward force placed on the chip. Due to the difference in wettability, the adhesive material then spreads among the second area by a wetting force generated by the greater second wettability of the second area surface causing the chip to be drawn down until reaching a predetermined position. The predetermined position can be determined by substrate protrusions or substrate cavities.

16 Claims, 12 Drawing Sheets

Etched cavity with peripheral area having better wettability.

(56) References Cited

U.S. PATENT DOCUMENTS

| | | |
|---|---|---|
| 7,825,501 B2 | 11/2010 | Zhu et al. |
| 2007/0057373 A1 | 3/2007 | Okumura et al. |
| 2008/0150163 A1* | 6/2008 | Ohse et al. .................... 257/783 |
| 2012/0007117 A1* | 1/2012 | Andrews ........................ 257/98 |
| 2012/0306104 A1* | 12/2012 | Choi et al. .................... 257/782 |

* cited by examiner

FIG. 3A Etched cavity with peripheral area having better wettability.

FIG. 3B Bonding area having better wettability surface and surrounded by the barrier.

FIG. 3C Etched cavity with inside area having better wettability surface.

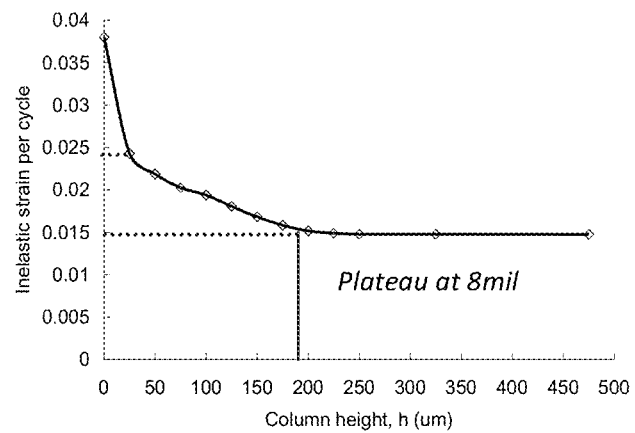
FIG. 4A
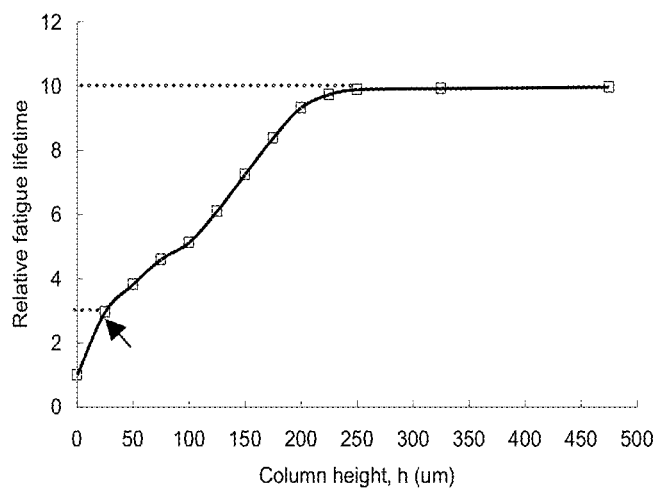
FIG. 4B
FIG. 4

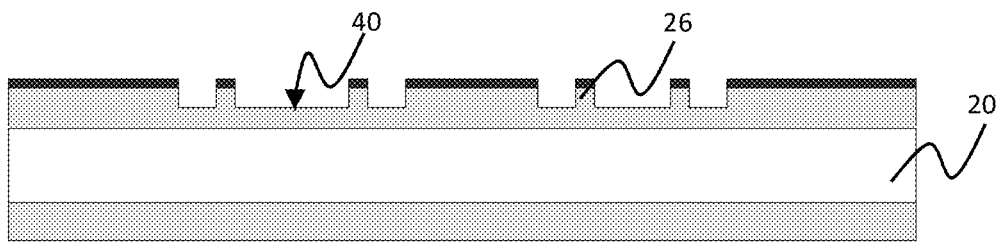
FIG. 6A
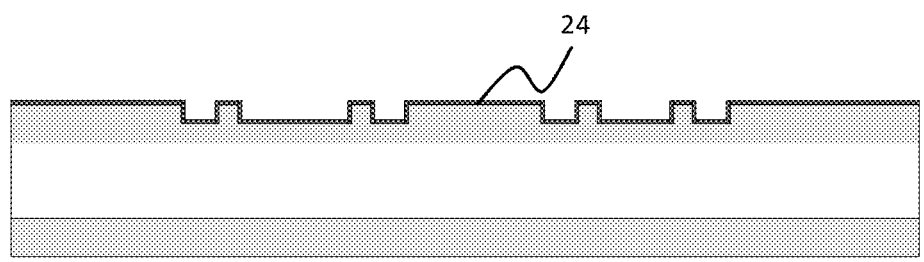
FIG. 6B
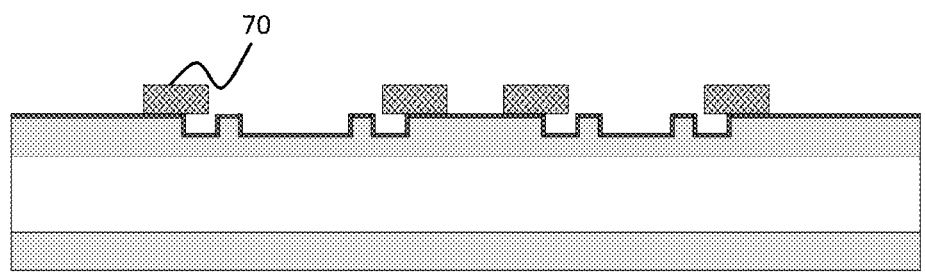
FIG. 6C
FIG. 6

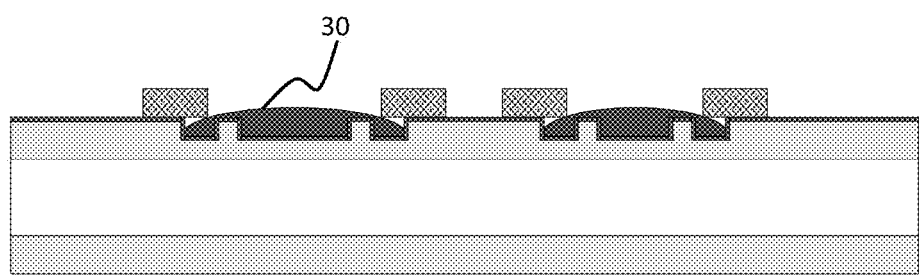
FIG. 6D
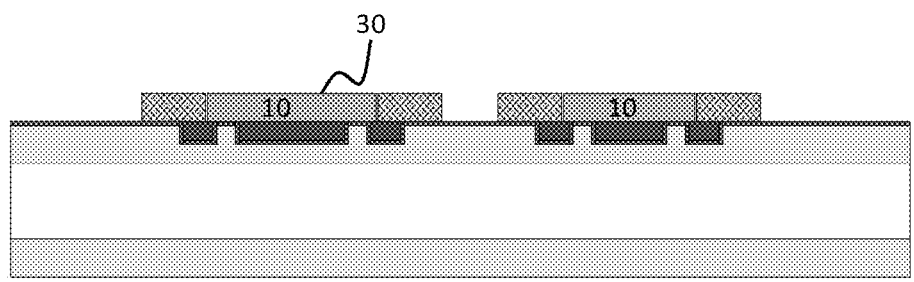
FIG. 6E
FIG. 6 (continued)

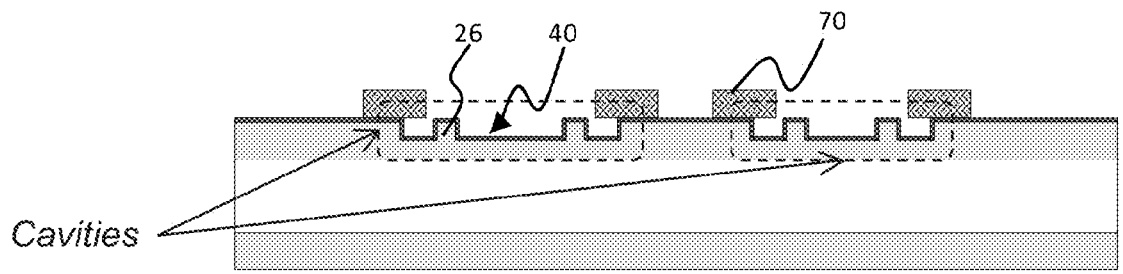
FIG. 7A
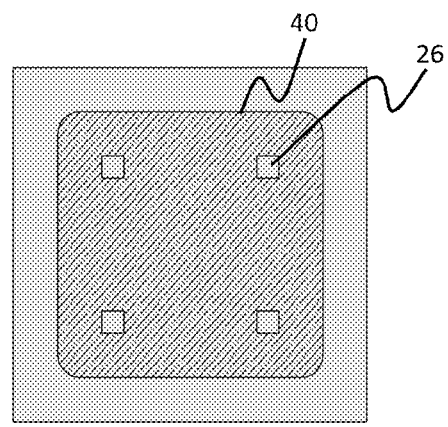
FIG. 7B
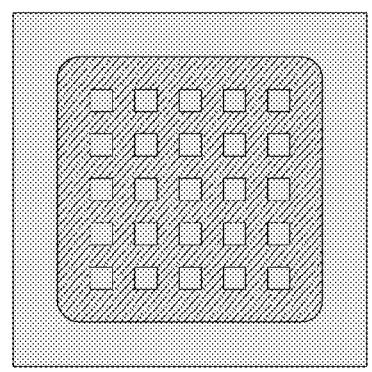
FIG. 7C
FIG. 7

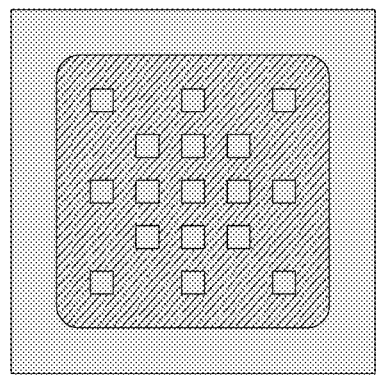
FIG. 7D
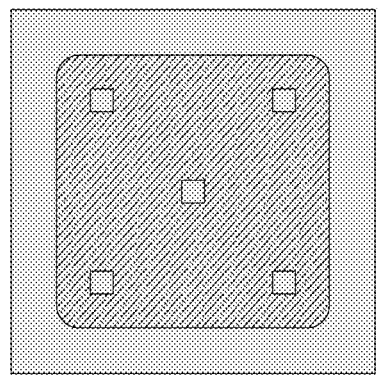
FIG. 7E
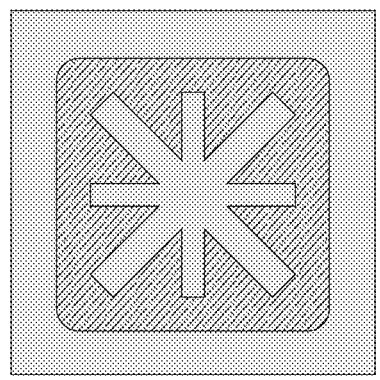
FIG. 7F
FIG. 7 (continued)

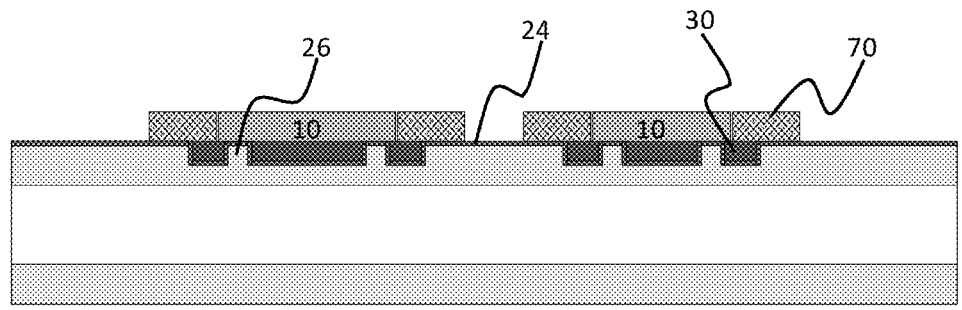
FIG. 8A
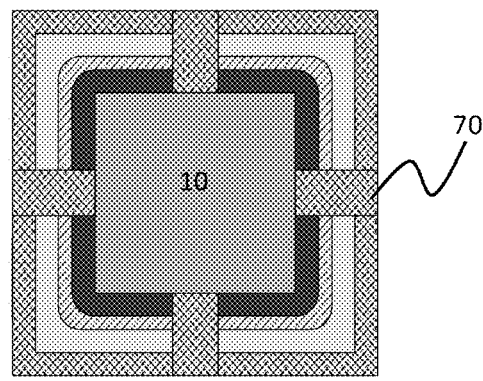
FIG. 8B
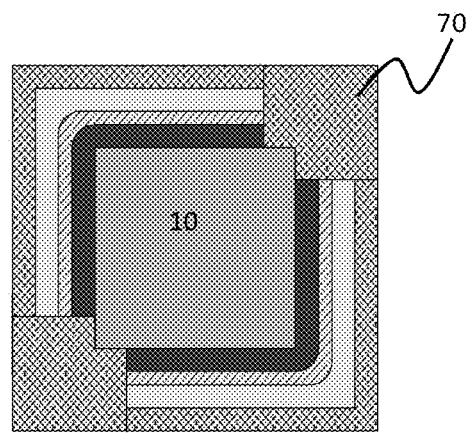
FIG. 8C
FIG. 8

HIGH POWER DIELECTRIC CARRIER WITH ACCURATE DIE ATTACH LAYER

FIELD OF THE INVENTION

The present invention relates to the field of electronics packaging and, more particularly, to a system for attaching a high power die to a substrate with a bond line of consistent and accurate thickness along the entire die.

BACKGROUND

Various advances in high power and high switching frequency electronic devices have been increasingly used in power applications in transportation systems, appliances, energy systems, and motor control. Such applications require power on the order of megawatts with operating temperatures on the order of 200° C. Exemplary high power devices are insulated gate bipolar transistors (IGBTs) that are semiconductor devices with four alternating layers and have a metal-oxide semiconductor gate structure. Due to the operating conditions of these devices, high dielectric breakdown voltage and high thermal conductivity are required in the device packaging. Typical substrates are ceramic-based direct bonded copper with flat copper. A bond line to such substrates is on the order of 0.4 mil to 3 mils.

Due to the high-power operation of these devices, it is important that the bond line be reliably uniform across the entire area of the bonded die. However, such reliably uniform bond lines have proven difficult to achieve with thin and/or uneven bondline thicknesses resulting in cracking as a result of high power switching that leads to thermal cycling, resulting in inelastic creep strain and crack growth. This results in partial or complete debonding of the die from the substrate.

Thus there is a need in the art for improved bonding systems that will maintain the required high dielectric breakdown voltage and high thermal conductivity necessary for high power and high frequency device applications.

SUMMARY OF THE INVENTION

The present invention relates to a system for bonding a die to a high power dielectric carrier such as a ceramic dielectric core with double-sided conductive layers. In the system, the upper conductive layer has a first area whose surface has a first wettability. A second area that at least partially surrounds the first area has a surface with a second wettability that is greater than the first wettability. During bonding, an adhesive material bonding a chip to the substrate spreads among the first area by a downward force placed on the chip. Due to the difference in wettability, the adhesive material then spreads among the second area by a wetting force generated by the greater second wettability of the second area surface causing the chip to be drawn down until reaching a predetermined position.

In one embodiment, the predetermined position is determined by protrusions in the substrate that act as stops for the placement of the die. In other configurations, an etched cavity defines the flow stop for the adhesive material. In an exemplary embodiment, the adhesive material includes a metal solder.

BRIEF DESCRIPTION OF THE DRAWINGS

In FIG. 4, FIGS. 4A and 4B depict increased bonding reliability for the bonding systems of the present invention.

In FIG. 6, FIGS. 6A to 6E depict formation of cavities and protrusions.

In FIG. 7, FIGS. 7A to 7G illustrate protrusion/column patterns.

In FIG. 8, FIGS. 8A to 8D show alignment feature patterns.

DETAILED DESCRIPTION

Figure 1:
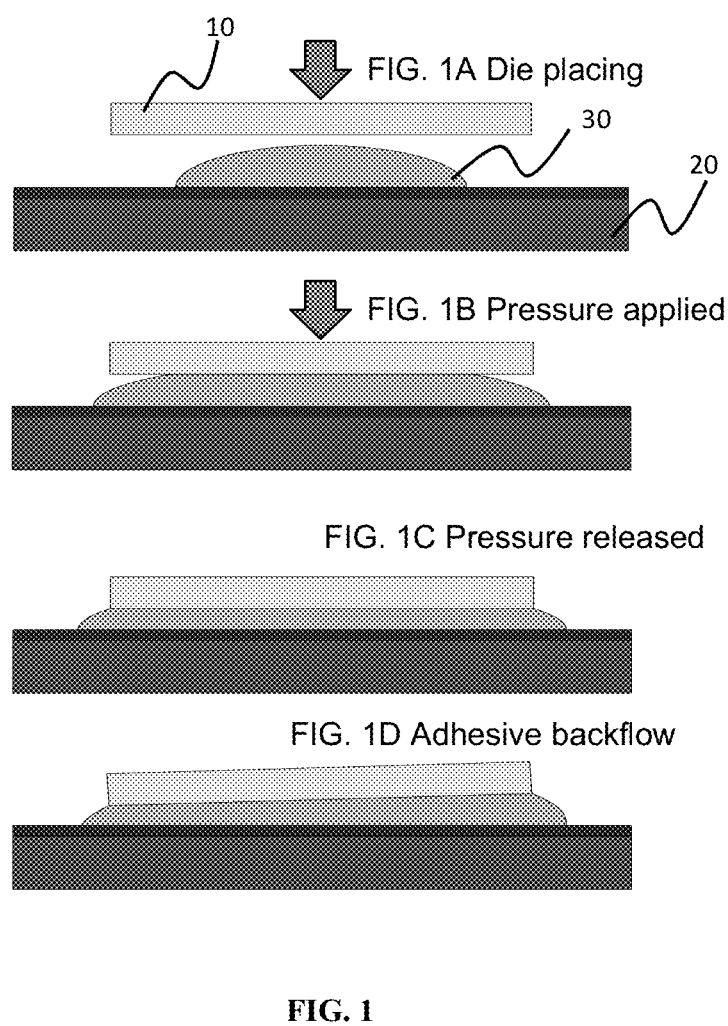
FIG. 1 depicts problems with a conventional die bonding system.

Turning to the drawings in detail, FIG. 1 depicts problems with conventional die bonding systems determined during the course of creating the present invention. In the conventional system of FIG. 1A, a die 10 is to be bonded to substrate 20 (such as a direct bonded copper substrate) through a bonding/adhesive medium such as solder 30 or another type of bonding/adhesive material. In FIG. 1B, pressure is applied in an attempt to create an even bond across the entire die area. In FIG. 1C, the pressure is released. However, before the bond is permanently solidified, adhesive backflow occurs as shown in FIG. 1D. The present inventors determined the backflow occurred as the result of a low wettability of the bonding material to the substrate, such that surface tension of the bonding material causes an uneven bond line thickness to be formed.

Figure 2:
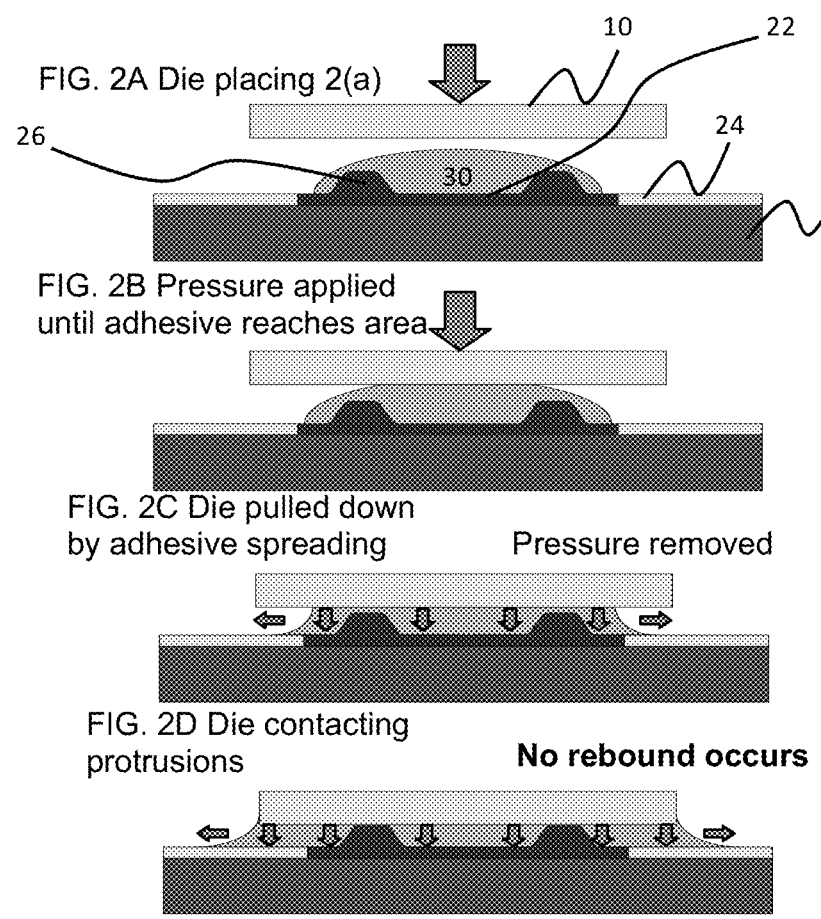
FIG. 2 depicts a die bonding system according to the present invention.

To prevent the adhesive backflow depicted in FIG. 1D, the system of FIG. 2 was created. In the system of FIG. 2, the die placement region includes regions having different wettabilities. "Wettability" relates to degree of ability of a liquid to contact a solid surface and is often designated in terms of the contact angle between the liquid and the solid with lower contact angles indicating that the liquid more readily wets the solid surface. When interfacial tension (adhesive/substrate) is larger than the substrate surface tension, the adhesive tends to ball up with a high contact angle. In contrast, when interfacial tension (adhesive/substrate) is smaller than the substrate surface tension, the adhesive tends to spread on the substrate surface due to the low contact angle.

Note that the degree of wettability is determined not only by the materials involved but also by the surface morphology of the surface to be wetted. For example, for materials of the same composition, a rough surface promotes wetting. Surfaces can be deliberately micromachined (chemically, mechanically, or through chemical-mechanical techniques) to induce different wettability characteristics. Surfaces with high wettability encourage liquid spreading which is important for forming a continuous layer. In contrast, surfaces with low wettability encourage de-wetting, a situation in which a liquid layer, once spread on a surface, forms discontinuities as the liquid "balls up" due to the interfacial tension being substantially higher than the substrate surface tension.

As seen in FIG. 2A, substrate 20 includes a first region 22 having a first wettability and a second region 24 having a higher wettability than first region 22. In the embodiment of FIG. 2A, the first wettability region 22 includes surface protrusions 26 that act as a self-aligning feature for the die 10 as it is bonded to the substrate 20. Although FIG. 2A shows protrusions 26 within region 22, it is understood that protrusions can be formed in other regions of the substrate/dielectric carrier conductive layer depending upon the overall desired bonding configuration.

In FIG. 2B, adhesive material 30 spreads due to applied pressure from the die 10. As the adhesive material 30 spreads towards the second region 24 having the higher wettability, die 10 is drawn downward due to the wetting force, shown in FIG. 2C. In FIG. 2D, the die has been pulled down into contact with protrusions 26 to form a uniform and predefined bondline by wetting force and protrusions.

The first region 22 and the second region 24 each have a different wettability that can be from two different materials with different levels of wettability or can be from two of the same materials having different surface morphologies that create different wettability (or a combination of different materials and different morphologies), depending upon the amount of wettability contrast desired. The selected amount of wettability difference between region 22 and region 24 is determined by factors such as the size of the die, the desired thickness of the final bondline, the desired thermal conductivity and the operation parameters of the finished device. Typically, the difference in wettability is selected to be in a range on the order of 100% to 400% greater (in terms of the ratio of the higher contact angle to the lower contact angle for the same adhesive material on surfaces with different wettabilities), more particularly 300% to 400% Surface morphology variations can range from a rough surface in region 24 and a relatively smoother surface in region 22 to a micromachined surface having a surface structure featuring micropillars or microcolumns on the order of a micron (in addition to the larger surface protrusions 26).

When different materials are selected for region 22 and 24, exemplary material combination includes (22/24: Cu/Cu, Cu/Au, Cu/Ag, Ni/Au, Ni/Ag). Adhesive material 30 is selected based on the materials used for the bonding region. Typical adhesive material, region 22 and 24 combinations include adhesive: (SnAg, SAC, SnPb),22: Cu, 24:(Cu, Au,Ag)). However, it is understood that any combination of materials can be used as long as the combination meets the conditions specified above.

Figure 3:
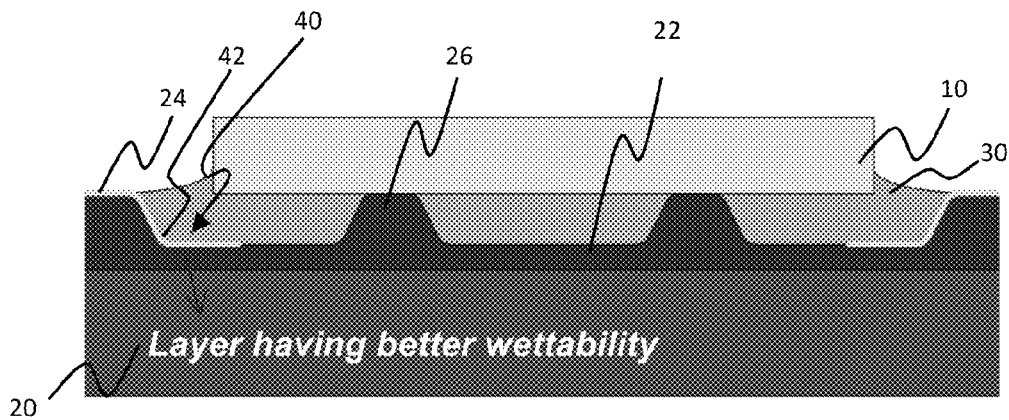
FIG. 3 depicts alternative die bonding systems of the present invention
Figure 3:
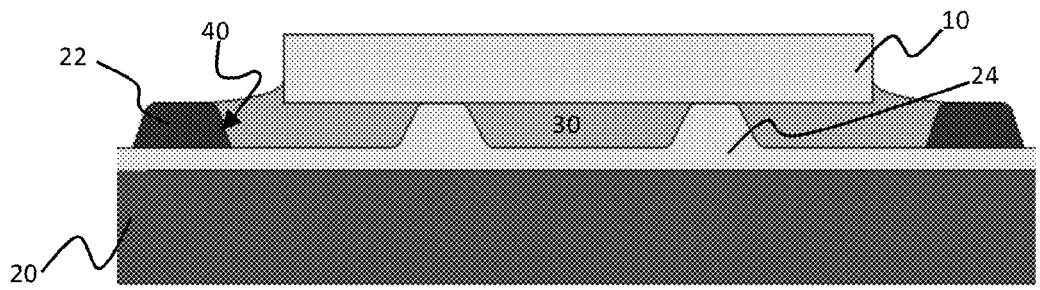
Figure 3:
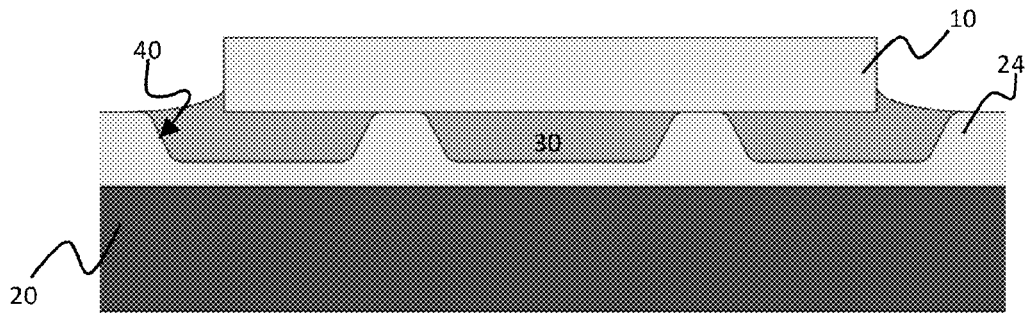

Various other configurations can be formed according to the present invention, particularly additional structures that will assist in forming a reliable and uniform bondline and creating self-aligning features for the die being bonded to the substrate. As seen in FIG. 3, various cavity structures and combinations of regions with various wettabilities can be used to both confine the adhesive material and create an even and reliable bond line. In FIG. 3A a cavity 40 is defined in a lower wettability material 22 including the protrusions 26. On the sidewalls 42 of cavity 40 a higher wettability material 24 is formed. As in the embodiment of FIG. 2, the die 10 is drawn downward by the wetting force, contacting protrusions 26.

In FIG. 3B, the higher wettability region 24 is formed in a central cavity with protrusions 26 also formed from the same higher wettability material 24. To assist in confining the adhesive material 30 in the cavity, lower wettability sidewalls 22 are used to confine adhesive material 30. As the material flows towards lower wettability sidewalls 22, the contact angle increases and the material remains within cavity 40.

In FIG. 3C a variant of the invention is shown in which the entire cavity, including protrusions 26, is formed from the same material with a high wettability surface 24. In this embodiment, the configuration of the cavity and the protrusions permits formation of an even bond line between die 10 and substrate 20. For the purposes of this embodiment, a high wettability material 24 is defined as one in which the adhesive material 30 forms a contact angle with material 24 of less than approximately 30 degrees.

FIG. 4 depicts various simulated mechanical performance improvements due to the bonding system of the present invention. In FIG. 4A, a 38% reduction in inelastic creep strain for a protrusion/column height of 8 mils is depicted. In FIG. 4B, for an even bond line thickness of 250 microns the fatigue life is increased by a factor of three.

Figure 5:
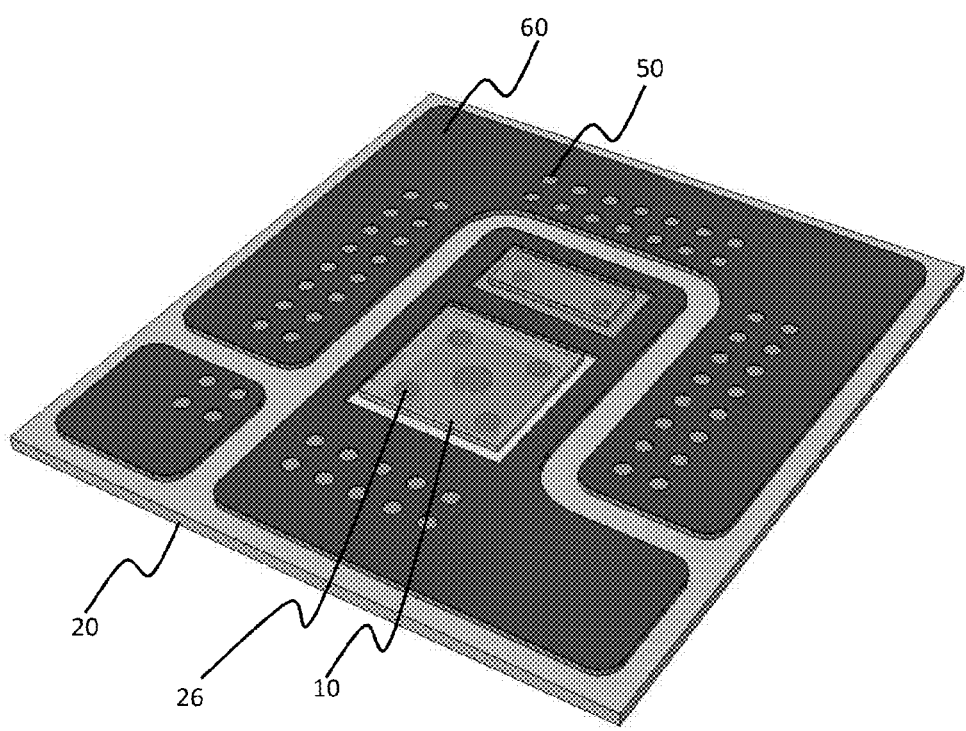
FIG. 5 depicts an electrical package aspect of the present invention.

The die attachment system of the present invention has further applications in forming an internal electrical path between the die 10 and input-output points through a conductive portion without the need for additional wiring. Turning to FIG. 5, input-output points 50 are defined by insulating solder mask 60. The solder mask is adjacent to die 10 which is set on protrusions 26 surrounded by high-wettability material region 24. One or more electrical bridges is constructed across the conductive portions on the substrate 20 via the input-output points 50. This is due to the fact that the bonded die 10 electrically contacts protrusions 26 to create an electrical path between the die and the input-output points 50 through the conductive portion formed on the substrate surface. Input-output points are connected to further elements typically through solder balls. Eliminating the need for additional wire bonding substantially reduces cost of the overall package as well as increasing performance, yield and reliability.

FIG. 6 depicts formation of cavities and protrusions for the bonding system of the present invention including optional alignment features/stops. In FIG. 6A, cavities 40 are formed by half-etching into a metallic surface of substrate 20. Simultaneously, protrusions/microcolumns 26 are defined in the cavity. In FIG. 6B, high wettability material layer 24 is deposited. In FIG. 6C, alignment features 70 are bonded in such a manner that they partially overhang the edges of cavities 40. Bonding material 30 is positioned within cavities 40 in FIG. 6D. In FIG. 6E, dies 10 are placed and compressed guided by the alignment features 70 and the bond lines are solidified.

Figures 7, 7G:
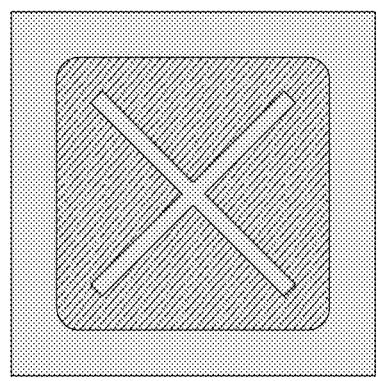

FIG. 7 illustrates a wide variety of protrusion/column 26 patterns that can be formed (in embodiments with or without optional alignment stops 70. FIG. 7B depicts a corner pattern FIG. 7C depicts a matrix pattern, FIG. 7D depicts a matrix-asterisk pattern, FIG. 7E depicts a face-centered pattern, FIG. 7F depicts an asterisk pattern, and FIG. 7G depicts a cross pattern. Note that these are only some examples of the many patterns that can be formed; a particular pattern can be selected based on die size, adhesive material and wettability material considerations along with other manufacturing considerations.

Figures 8, 8D:
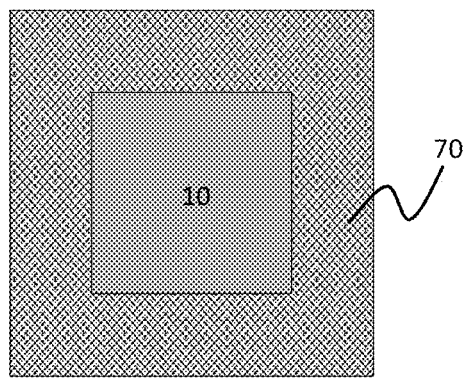

FIG. 8 depicts various arrangements for alignment features/stops 70. FIG. 8B is an edge-center arrangement of alignment features 70; FIG. 8C is a diagonal arrangement of alignment features 70, and 8D is a peripheral arrangement of alignment features 70.

According to the present invention, micro-features compatible with DBC processes are formed to enhance reliability and maintain a high dielectric breakdown voltage and high thermal conductivity. A wetting enhancing surface treatment on copper is optionally used to achieve the new structures depicted in the FIGS. While the foregoing invention has been described with respect to various embodiments, such embodiments are not limiting. Numerous variations and modifications would be understood by those of ordinary skill in the art. Such variations and modifications are considered to be included within the scope of the following claims.

What is claimed is:

1. A high power dielectric carrier including a dielectric substrate and at least an upper conductive layer, the upper conductive layer being divided into plural conductive portions separated and electrically isolated from each other, the upper conductive layer comprising:

a first area whose surface has a first wettability;
a second area, which at least partially surrounds the first area, whose surface has a second wettability greater than the first wettability, such that when a die is bonded to the upper conductive layer with an adhesive material, the adhesive material spreads among the first area caused by a downward force placed on the die and then spreads among the second area by a wetting force generated by the greater second wettability of the second area surface, causing the die to be drawn down;
one or more protrusions formed on the upper conductive layer, and arranged to act as stops for placement of the die when the die is drawn down due to the wetting force, such that the die is bonded to the upper conductive layer of the high power dielectric carrier by the adhesive material without adhesive backflow and to form a uniform bondline between the die and the carrier by the wetting force and the one or more protrusions;
a cavity containing the first area or/and the second area, wherein the cavity has the one or more protrusions formed therein, and is formed in one of the plural conductive portions;
an insulating mask covering the surfaces of the conductive portions and exposing one or more I/O points for interconnection; and
one or more electrical bridges constructed across the conductive portions via the I/O points to form a target electrical component;
wherein the bonded die electrically contacts the one or more protrusions, such that an internal electrical path is formed between the die and the I/O points through the conductive portion without the need for additional wiring.

2. The high power dielectric carrier of claim 1, wherein the first and second areas have the same composition and the difference in wettability of the first and second areas is caused by different surface morphologies in the first and second areas.

3. The high power dielectric carrier of claim 1, wherein the upper conductive layer further comprises one or more alignment structures with predefined patterns located on the periphery of the cavity to position the die.

4. A method for bonding a die to the high power dielectric carrier of claim 1 comprising:
positioning adhesive material in the first area such that it is positioned above the one or more protrusions;
positioning the die on the adhesive material with a downward force placed on the die to spread the adhesive from the first area until reaching the second area;
enabling the die to be drawn downward by the wetting force until reaching the one or more protrusions due to the increased wettability of the second area by the adhesive material such that the die is bonded to the upper conductive layer of the high power dielectric carrier by the adhesive material without adhesive backflow and to form a uniform bondline between the die and the carrier by the wetting force and the one or more protrusions.

5. A method of making the high power dielectric carrier of claim 1, wherein forming the upper conductive layer comprises:
etching a cavity and the one or more protrusions; and
defining the first and second wettability areas.

6. The high power dielectric carrier of claim 1 wherein the dielectric substrate comprises a ceramic layer and a lower conductive layer is positioned on a lower surface of the dielectric substrate.

7. The method of claim 4 wherein the dielectric substrate comprises a ceramic layer and a lower conductive layer is positioned on a lower surface of the dielectric substrate.

8. A method for bonding a die to the high power dielectric carrier of claim 1 comprising:
positioning adhesive material in the first area;
positioning the die on the adhesive material with a downward force placed on the die to spread the adhesive from the first area until reaching the second area;
enabling the die to be drawn downward by the wetting force until reaching a cavity edge surface due to the increased wettability of the second area by the adhesive material such that the die is bonded to the upper conductive layer of the high power dielectric carrier by the adhesive material without adhesive backflow and to form a uniform bondline between the die and the carrier by the wetting force and the one or more protrusions.

9. A method according to claim 5 further comprising depositing a high wettability material at one or more peripheral regions of the cavity.

10. A method according to claim 5 wherein the cavity is formed in a high wettability material and a low wettability material is formed at one or more peripheral regions of the cavity.

11. A high power dielectric carrier including a dielectric substrate and at least an upper conductive layer, the upper conductive layer comprising:
a first area whose surface has a first wettability;
one or more protrusions protruded above the first area surface, the protrusions being arranged to act as stops for die placement when a die is drawn towards to the first area;
a cavity formed within the upper conductive layer and being larger than the die in size, wherein the first area is a bottom of the cavity, and the one or more protrusions are formed within the cavity; and
a second area surrounding the first area and being operable, in combination with the first area, for confining an adhesive material when positioned in the cavity and providing a force to cause the die to be drawn down until contacting the one or more protrusions for the die placement so as to bond the die to the upper conductive layer of the high power electric carrier by the adhesive material without adhesive backflow and to create an even and reliable bond line thickness with the die following die positioning.

12. The high power dielectric carrier of claim 11, wherein the upper conductive layer is divided into plural conductive portions separated and electrically isolated from each other, wherein the cavity is formed in one of the plural conductive portions, and the upper conductive layer further comprises:
an insulating mask covering the surfaces of the conductive portions and exposing one or more I/O points for interconnection; and
one or more electrical bridges constructed across the conductive portions via the I/O points to form a target electrical component;
wherein the bonded die electrically contacts the one or more protrusions, such that an internal electrical path is formed between the die and the I/O points through the conductive portion without the need for additional wiring.

13. The high power dielectric carrier of claim 11, wherein the second area, whose surface has a second wettability greater than the first wettability, such that when the die is bonded to the upper conductive layer with the adhesive material, the adhesive material spreads among the first area caused by a downward force placed on the die and then spreads among the second area by a wetting force generated by the greater second wettability of the second area surface, causing the die to be drawn down until reaching the one or more protrusions.

14. The high power dielectric carrier of claim 11 wherein the second area is a wall of the cavity for surrounding the cavity.

15. The high power dielectric carrier of claim 11, wherein the first and second areas have the same composition and the difference in wettability of the first and second areas is caused by different surface morphologies in the first and second areas.

16. The high power dielectric carrier of claim 11, wherein the upper conductive layer further comprises one or more alignment structures with predefined patterns located on the periphery of the cavity to position the die.

\* \* \* \* \*